US012744535B1

(12) United States Patent
Peng et al.

(10) Patent No.: US 12,744,535 B1
(45) Date of Patent: Sep. 22, 2026

(54) DIGITAL CLOCK DATA RECOVERY CIRCUIT AND METHOD FOR LOCKING FREQUENCY OF RECOVERY CLOCK SIGNAL THEREOF

(71) Applicant: HIMAX TECHNOLOGIES LIMITED, Tainan City (TW)

(72) Inventors: Yun Peng, Tainan City (TW); Yushyang Huang, Tainan City (TW)

(73) Assignee: HIMAX TECHNOLOGIES LIMITED, Tainan City (TW)

( * ) Notice: Subject to any disclaimer, the term of this patent is extended or adjusted under 35 U.S.C. 154(b) by 0 days.

(21) Appl. No.: 19/194,019

(22) Filed: Apr. 30, 2025

(51) Int. Cl.
*H03L 7/087* (2006.01)
*H03L 7/099* (2006.01)

(52) U.S. Cl.
CPC ............ *H03L 7/087* (2013.01); *H03L 7/0992* (2013.01); *H03L 7/0998* (2013.01)

(58) Field of Classification Search
CPC ...... H03L 7/087; H03L 7/0992; H03L 7/0998
USPC .................................................. 327/156–159
See application file for complete search history.

(56) References Cited

U.S. PATENT DOCUMENTS

2026/0025259 A1* 1/2026 Vercesi ................... H04L 7/033

OTHER PUBLICATIONS

Behzad Razavi et al., "Challenges in the design of high-speed clock and data recovery circuits" IEEE Communications Magazine, pp. 94-101, Aug. 2002.

* cited by examiner

*Primary Examiner* — Tomi Skibinski
(74) *Attorney, Agent, or Firm* — CKC & Partners Co., LLC

(57) ABSTRACT

A digital clock data recovery circuit is provided and includes a phase lock loop circuit and a frequency lock loop circuit coupled to the phase lock loop circuit. The phase lock loop circuit generates a recovery clock signal according to a pre-divider value, a feedback divider value, and an input reference clock signal. The frequency lock loop circuit adjusts one of the pre-divider value and the feedback divider value according to the input reference clock signal and an input data clock signal, thereby locking a frequency of the recovery clock signal to a frequency of the input data clock signal. The frequency lock loop circuit is implemented by a digital circuit. The digital clock data recovery circuit operates in a data recovery mode after the frequency of the recovery clock signal is locked.

20 Claims, 8 Drawing Sheets

DIGITAL CLOCK DATA RECOVERY CIRCUIT AND METHOD FOR LOCKING FREQUENCY OF RECOVERY CLOCK SIGNAL THEREOF

BACKGROUND

Field of Invention

The present disclosure relates to a digital clock data recovery circuit. More particularly, the present disclosure relates to a wide frequency range digital clock data recovery circuit using a frequency lock loop circuit.

Description of Related Art

For high-speed serial transmission system, an original data signal undergoes attenuation and distortion in transmission. Therefore, the clock data recovery circuit is required to output data and synchronized clock by using a reference clock signal.

Accuracy of the frequency of the reference clock signal provided to the clock data recovery circuit is a key factor which affecting the correctness of data recovery. If the frequency of the reference clock drifts, an undesired sampling error occurs, and the data cannot be correctly recovered. The problem of frequency drift in the reference clock is more serious when the reference clock signal is provided by an on-chip oscillator.

SUMMARY

It is an objective of the present disclosure to provide a digital clock data recovery circuit using a frequency lock loop circuit so as to achieve a wide frequency range digital clock data recovery circuit.

The present disclosure provides a digital clock data recovery circuit. The digital clock data recovery circuit includes a phase lock loop circuit and a frequency lock loop circuit. The phase lock loop circuit generates a recovery clock signal according to a pre-divider value, a feedback divider value, and an input reference clock signal. The frequency lock loop circuit is coupled to the phase lock loop circuit. The frequency lock loop circuit adjusts one of the pre-divider value and the feedback divider value according to the input reference clock signal and an input data clock signal, thereby locking a frequency of the recovery clock signal to a frequency of the input data clock signal. The frequency lock loop circuit is implemented by a digital circuit. The digital clock data recovery circuit operates in a data recovery mode after the frequency of the recovery clock signal is locked.

In accordance with one or more embodiments of the present disclosure, the phase lock loop circuit multiplies the input reference clock signal by a ratio of the feedback divider value to the pre-divider value, thereby generating the recovery clock signal.

In accordance with one or more embodiments of the present disclosure, the digital clock data recovery circuit further includes a first frequency divider and a second frequency divider. The first frequency divider is coupled to the frequency lock loop circuit. The first frequency divider generates a first dividing signal. The second frequency divider is coupled to the frequency lock loop circuit. The second frequency divider generates a second dividing signal. A frequency of the first dividing signal is 1/M times of the frequency of the input data clock signal and a frequency of the second dividing signal is 1/N times of the frequency of the recovery clock signal, and M>N.

In accordance with one or more embodiments of the present disclosure, M is equal to 2560, and N is equal to 5, and the digital clock data recovery circuit operates at a half-rate.

In accordance with one or more embodiments of the present disclosure, the frequency lock loop circuit obtains an edge number by counting number of rising edges of the second dividing signal existing during a high level period of the first dividing signal. In response to the edge number being equal to a target value, the frequency of the recovery clock signal is locked to the frequency of the input data clock signal.

In accordance with one or more embodiments of the present disclosure, the target value is equal to 256.

In accordance with one or more embodiments of the present disclosure, the frequency lock loop circuit is configured to perform following steps: resetting the frequency lock loop circuit; setting initial values of the pre-divider value and the feedback divider value; waiting the phase lock loop circuit to be locked; entering a read mode to determine whether the edge number is equal to the target value, in response to the phase lock loop circuit being locked; entering a write mode to adjust one of the pre-divider value and the feedback divider value, in response to the edge number being not equal to the target value; entering the read mode after one of the pre-divider value and the feedback divider value is adjusted and the phase lock loop circuit is locked; and locking the frequency of the recovery clock signal to the frequency of the input data clock signal, in response to the edge number being equal to the target value.

In accordance with one or more embodiments of the present disclosure, the frequency lock loop circuit further checks a pattern of the input data clock signal to ensure that the input data clock signal is valid data after determining that the edge number is equal to the target value.

In accordance with one or more embodiments of the present disclosure, the frequency lock loop circuit calculates a difference between the edge number and the target value, thereby adjusting one of the pre-divider value and the feedback divider value based on the difference.

In accordance with one or more embodiments of the present disclosure, in response to an absolute value of the difference being larger than or equal to 128, the frequency lock loop circuit adjusts the pre-divider value.

In accordance with one or more embodiments of the present disclosure, in response to the absolute value of the difference being larger than or equal to 192, the frequency lock loop circuit adds or subtracts 2 to the pre-divider value. In response to the absolute value of the difference being larger than or equal to 128 and less than 192, the frequency lock loop circuit adds or subtracts 1 to the pre-divider value.

In accordance with one or more embodiments of the present disclosure, in response to an absolute value of the difference being less than 128, the frequency lock loop circuit adjusts the feedback divider value.

In accordance with one or more embodiments of the present disclosure, in response to the absolute value of the difference being larger than or equal to 32 and less than 128, the frequency lock loop circuit adds or subtracts an integer that rounds up a value of dividing the absolute value of the difference by 4 to the feedback divider value. In response to the absolute value of the difference being larger than or equal to 16 and less than 32, the frequency lock loop circuit adds or subtracts the integer that rounds up the value of dividing the absolute value of the difference by 8 to the feedback divider value. In response to the absolute value of the difference being larger than or equal to 8 and less than 16, the frequency lock loop circuit adds or subtracts the integer that rounds up the value of dividing the absolute value of the difference by 16 to the feedback divider value. In response to the absolute value of the difference being larger than or equal to 4 and less than 8, the frequency lock loop circuit adds or subtracts the integer that rounds up the value of dividing the absolute value of the difference by 32 to the feedback divider value. In response to the absolute value of the difference being less than 4, the frequency lock loop circuit adds or subtracts 1 to the feedback divider value.

In accordance with one or more embodiments of the present disclosure, the digital clock data recovery circuit further includes an equalizer, a phase detector, a loop filter, a phase integrator, and a phase interpolator. The equalizer receives input data signals to generate the input data clock signal. The phase detector is coupled to the equalizer and the phase lock loop circuit. The phase detector uses the recovery clock signal to sample the input data signals. The loop filter is coupled to the phase detector. The loop filter provides filtering function. The phase integrator is coupled to the phase detector and the loop filter. The phase integrator quantifies a phase difference according to a control signal outputted by the phase detector. The phase interpolator is coupled to the phase integrator, the phase lock loop circuit, and the phase detector. The phase interpolator shifts a phase of the recovery clock signal according to the phase difference. The equalizer, the phase detector, the loop filter, the phase integrator, and the phase interpolator are all implemented by digital circuits.

The present disclosure further provides a method for locking a frequency of a recovery clock signal of a digital clock data recovery circuit. The method includes: utilizing a phase lock loop circuit to generate the recovery clock signal according to a pre-divider value, a feedback divider value, and an input reference clock signal; and utilizing a frequency lock loop circuit to adjust one of the pre-divider value and the feedback divider value according to the input reference clock signal and an input data clock signal, thereby locking a frequency of the recovery clock signal to a frequency of the input data clock signal. The frequency lock loop circuit is implemented by a digital circuit. The digital clock data recovery circuit operates in a data recovery mode after the frequency of the recovery clock signal is locked.

In accordance with one or more embodiments of the present disclosure, the input reference clock signal is multiplied by a ratio of the feedback divider value to the pre-divider value, thereby generating the recovery clock signal.

In accordance with one or more embodiments of the present disclosure, the method further includes: obtaining an edge number by counting number of rising edges of a second dividing signal existing during a high level period of a first dividing signal; and locking the frequency of the recovery clock signal to the frequency of the input data clock signal, in response to the edge number being equal to a target value. The frequency of the first dividing signal is 1/M times of the frequency of the input data clock signal and the frequency of the second dividing signal is 1/N times of the frequency of the recovery clock signal, and M>N.

In accordance with one or more embodiments of the present disclosure, the method further includes: resetting the frequency lock loop circuit; setting initial values of the pre-divider value and the feedback divider value; waiting the phase lock loop circuit to be locked; entering a read mode to determine whether the edge number is equal to the target value, in response to the phase lock loop circuit being locked; entering a write mode to adjust one of the pre-divider value and the feedback divider value, in response to the edge number being not equal to the target value; and entering the read mode after one of the pre-divider value and the feedback divider value is adjusted and the phase lock loop circuit is locked.

In accordance with one or more embodiments of the present disclosure, the method further includes: checking a pattern of the input data clock signal to ensure that the input data clock signal is valid data after determining that the edge number is equal to the target value.

In accordance with one or more embodiments of the present disclosure, the method further includes: calculating a difference between the edge number and the target value, thereby adjusting one of the pre-divider value and the feedback divider value based on the difference.

In order to make the above features and advantages of the present disclosure more apparent and understandable, the following embodiments of the present disclosure, together with the accompanying drawings, are described in detail below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present disclosure are further described in detail below with reference to the accompanying drawings. However, the embodiments described are not intended to limit the present disclosure and it is not intended for the description of operations to limit the order of implementation. The terms "first" and "second" used in the specification should be understood as identifying units or data described by the same terminology, and do not refer to a particular order or sequence.

Figure 1:
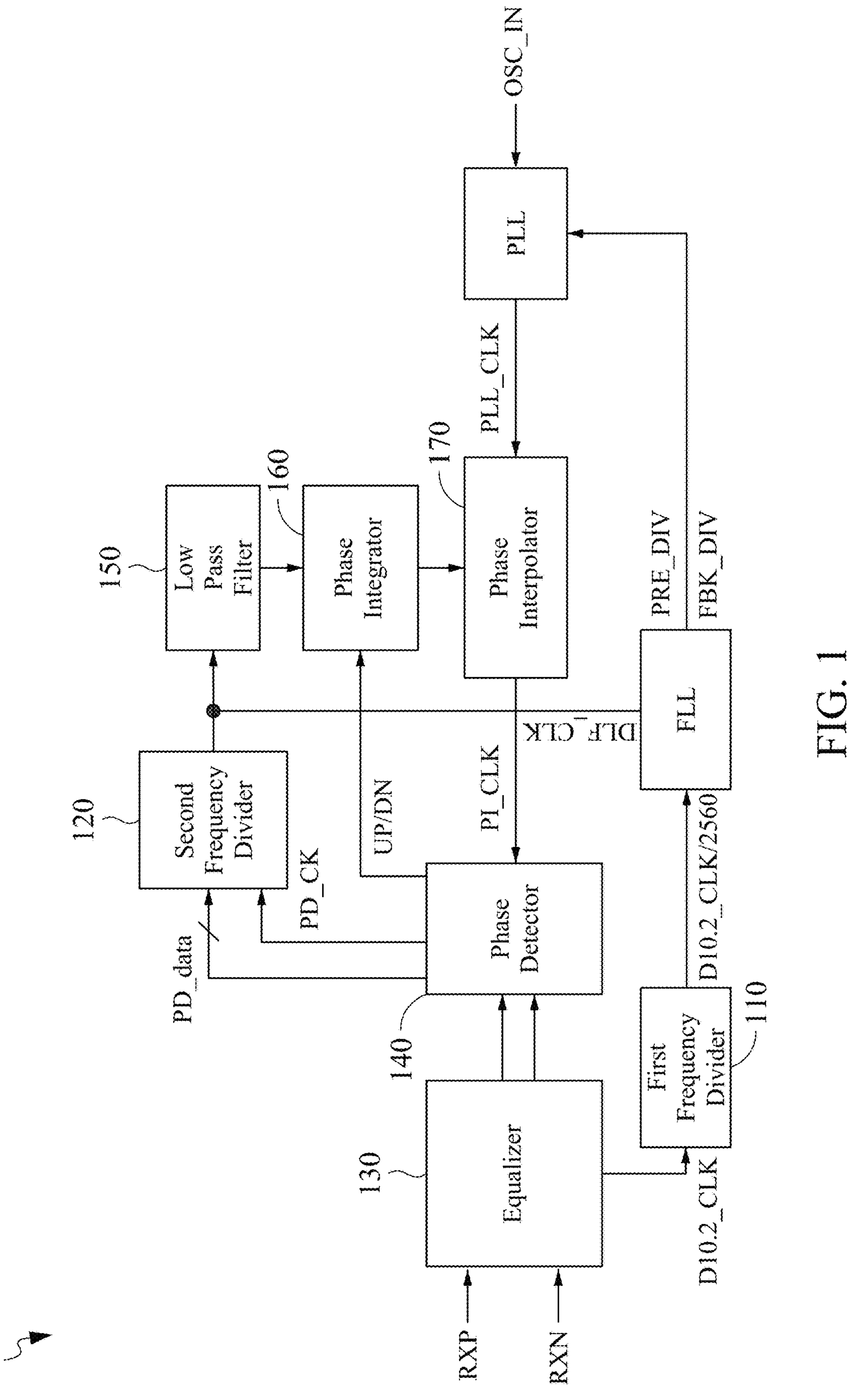
FIG. 1 shows a circuit diagram of a digital clock data recovery circuit according to some embodiments of the present disclosure.

FIG. 1 shows a circuit diagram of a digital clock data recovery circuit 10 according to some embodiments of the present disclosure. The digital clock data recovery circuit 10 includes a phase lock loop circuit PLL, a frequency lock loop circuit FLL, a first frequency divider 110, a second frequency divider 120, an equalizer 130, a phase detector 140, a loop filter 150, a phase integrator 160, and a phase interpolator 170.

The phase detector 140 is coupled to the equalizer 130. The phase detector 140 is coupled to the phase lock loop circuit PLL through the phase interpolator 170. The loop filter 150 is coupled to the phase detector 140 through the second frequency divider 120. The phase integrator 160 is coupled to the phase detector 140 and the loop filter 150. The phase interpolator 170 is coupled to the phase integrator 160, the phase lock loop circuit PLL and the phase detector 140.

The first frequency divider 110 is coupled to the frequency lock loop circuit FLL. The second frequency divider 120 is coupled to the frequency lock loop circuit FLL. The frequency lock loop circuit FLL is coupled to the equalizer 130 through the first frequency divider 110. The frequency lock loop circuit FLL is coupled to the phase lock loop circuit PLL.

In some embodiments of the present disclosure, the phase lock loop circuit PLL receives an input reference clock signal OSC_IN to generate a recovery clock signal PLL_CLK according to a pre-divider value PRE_DIV of a pre-divider in the phase lock loop circuit PLL, a feedback divider value FBK_DIV of a feedback divider in the phase lock loop circuit PLL, and the input reference clock signal OSC_IN. Specifically, the phase lock loop circuit PLL multiplies the input reference clock signal OSC_IN by a ratio of the feedback divider value FBK_DIV to the pre-divider value PRE_DIV, thereby generating the recovery clock signal PLL_CLK. In other words, PLL_CLK=OSC_IN*FBK_DIV/PRE_DIV. Each of the feedback divider value FBK_DIV and the pre-divider value PRE_DIV is an integer.

The phase interpolator 170 receives the recovery clock signal PLL_CLK. The phase interpolator 170 shifts the phase of the recovery clock signal PLL_CLK to generate the phase-shifted recovery clock signal PI_CLK.

The equalizer 130 receives input data signals RXP and RXN to generate an input data clock signal D10.2_CLK according to the frequency of the input data signals RXP and RXN. In other words, the input data clock signal D10.2_CLK corresponds to the frequency of the input data signals RXP and RXN.

The first frequency divider 110 receives the input data clock signal D10.2_CLK to generate a first dividing signal D10.2_CLK/2560. A frequency of the first dividing signal D10.2_CLK/2560 is 1/M times of the frequency of the input data clock signal D10.2_CLK. In some embodiments of the present disclosure, M is equal to 2560.

The equalizer 130 eliminates the de offset of the input data signals RXP and RXN and amplifies the high-frequency signal in the input data signals RXP and RXN, thereby transmitting the amplified input data signals to the phase detector 140. The phase detector 140 receives the amplified input data signals and the phase-shifted recovery clock signal PI_CLK. The phase detector 140 uses the phase-shifted recovery clock signal PI_CLK to sample the amplified input data signals, thereby detecting phase lead or phase lag of the phase-shifted recovery clock signal PI_CLK corresponding to the amplified input data signals. The aforementioned detecting result of the phase detector 140 corresponds to a control signal UP/DN which is transmitted to the phase integrator 160 by the phase detector 140.

The phase detector 140 further transmits a data signal PD_data and a clock signal PD_CK to the second frequency divider 120. The data signal PD_data corresponds to the input data signals RXP and RXN and the clock signal PD_CK corresponds to the phase-shifted recovery clock signal PI_CLK.

The second frequency divider 120 receives the clock signal PD_CK to generate a second dividing signal DLF_CLK. A frequency of the second dividing signal DLF_CLK is 1/N times of the frequency of the clock signal PD_CK. Since the clock signal PD_CK corresponds to the phase-shifted recovery clock signal PI_CLK and the frequency of the phase-shifted recovery clock signal PI_CLK is equal to the frequency of the recovery clock signal PLL_CLK, the frequency of the second dividing signal DLF_CLK is 1/N times of the frequency of the recovery clock signal PLL_CLK. In some embodiments of the present disclosure, N is equal to 5. Therefore, it can be understood that M>N.

The loop filter 150 receives the data signal PD_data and provides filtering function, so as to increase the stability of the digital clock data recovery circuit 10. The phase integrator 160 receives the filtered data signal and the control signal UP/DN. The phase integrator 160 quantifies a phase difference between the phase-shifted recovery clock signal PI_CLK and the data signal PD_data according to the detecting result (i.e., the control signal UP/DN) of the phase detector 140. In other words, the phase integrator 160 quantifies the phase difference according to the control signal UP/DN outputted by of the phase detector 140.

The phase interpolator 170 receives the recovery clock signal PLL_CLK and the phase difference to shift a phase of the recovery clock signal PLL_CLK according to the phase difference, thereby generating the phase-shifted recovery clock signal PI_CLK.

The frequency lock loop circuit FLL receives the first dividing signal D10.2_CLK/2560 and the second dividing signal DLF_CLK. As mentioned above, the first dividing signal D10.2_CLK/2560 is related to the input data clock signal D10.2_CLK, and the second dividing signal DLF_CLK is related to clock signal PD_CK, and the clock signal PD_CK is related to the phase-shifted recovery clock signal PI_CLK, and the phase-shifted recovery clock signal PI_CLK is related to the recovery clock signal PLL_CLK, and the recovery clock signal PLL_CLK is related to the input reference clock signal OSC_IN. The frequency lock loop circuit FLL adjusts one of the pre-divider value PRE_DIV and the feedback divider value FBK_DIV according to the input reference clock signal OSC_IN and the input data clock signal D10.2_CLK, thereby locking the frequency of the recovery clock signal PLL_CLK to the frequency of the input data clock signal D10.2_CLK. In addition, the digital clock data recovery circuit 10 operates in a data recovery mode after the frequency of the recovery clock signal PLL_CLK is locked.

Specifically, the digital clock data recovery circuit 10 adopts the frequency lock loop circuit FLL to lock the frequency of the recovery clock signal PLL_CLK to the frequency of the input data clock signal D10.2_CLK, thereby solving the problem of frequency drift in the input reference clock signal OSC_IN. In other words, the digital clock data recovery circuit 10 adopts the frequency lock loop circuit FLL to realize a wide frequency range digital clock data recovery circuit.

In some embodiments of the present disclosure, the frequency lock loop circuit FLL, the first frequency divider 110, the second frequency divider 120, the equalizer 130, the phase detector 140, the loop filter 150, the phase integrator 160, and the phase interpolator 170 are all implemented by digital circuits, thereby realizing the digital clock data recovery circuit 10.

Figure 2:
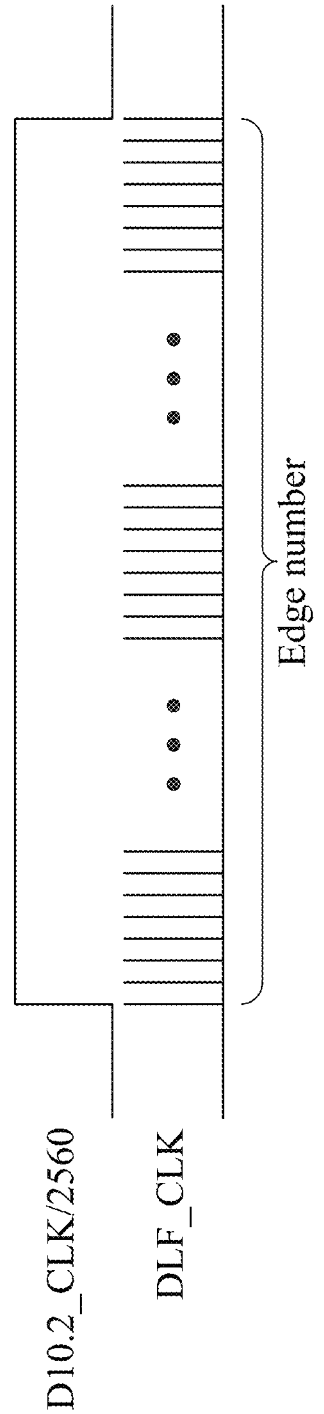
FIG. 2 is a drawing for illustrating a process of a read mode of a frequency lock loop circuit according to some embodiments of the present disclosure.

FIG. 2 is a drawing for illustrating the process of the read mode of the frequency lock loop circuit FLL according to some embodiments of the present disclosure. As shown in FIG. 2, regarding the read mode of the frequency lock loop circuit FLL, the frequency lock loop circuit FLL obtains an edge number by counting number of rising edges of the second dividing signal DLF_CLK existing during a high level period of the first dividing signal D10.2_CLK/2560. In response to the edge number being equal to a target value, the frequency of the recovery clock signal PLL_CLK is locked to the frequency of the input data clock signal D10.2_CLK.

In some embodiments of the present disclosure, the target value is equal to 256. Please note that the digital clock data recovery circuit 10 operates at a half-rate. Therefore, 2560 (i.e., M)=256 (i.e., the target value)*2 (i.e., the half-rate)*5 (i.e., N).

Figure 3:
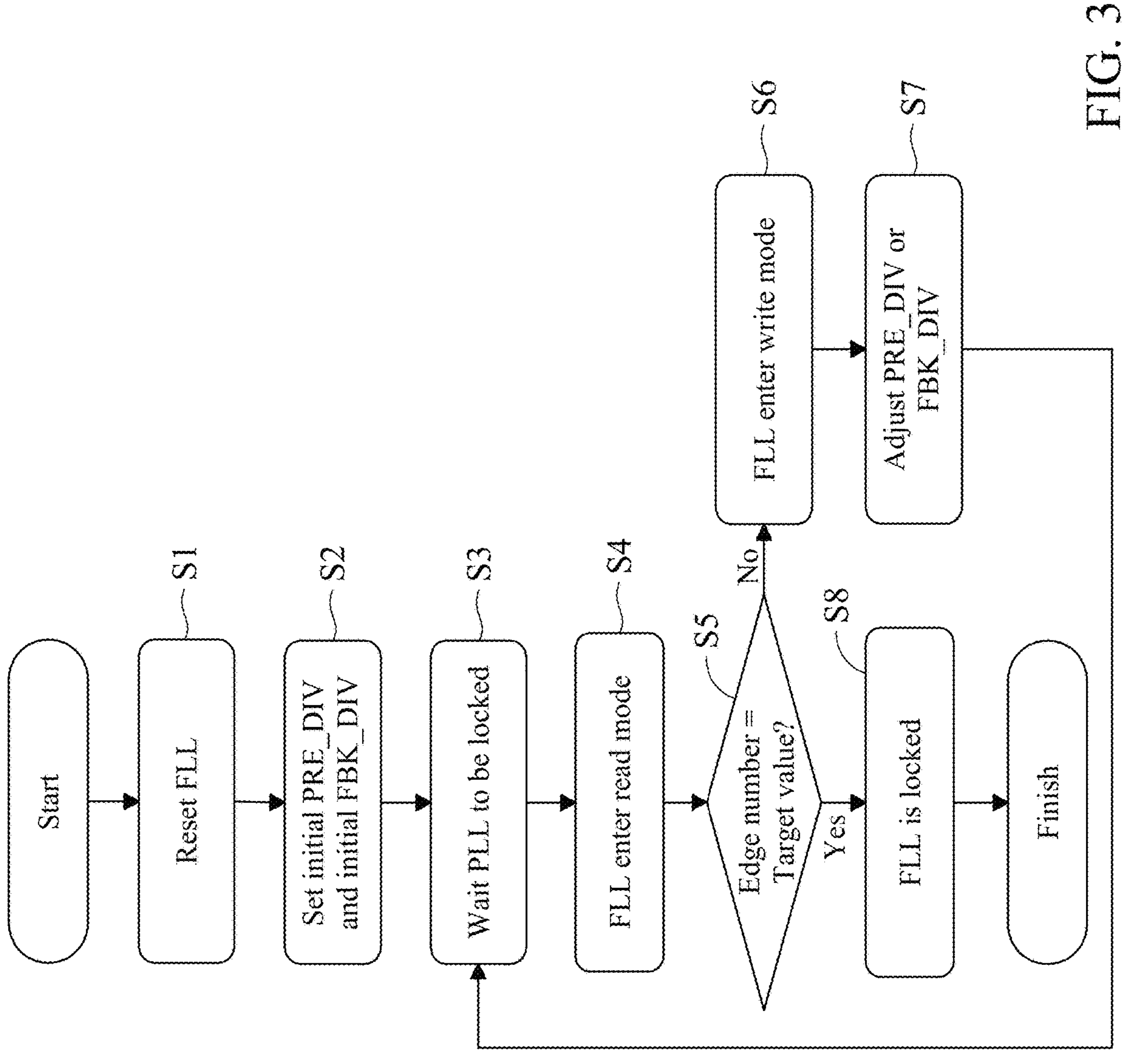
FIG. 3 is a flowchart of steps performed by the frequency lock loop circuit according to some embodiments of the present disclosure.
Figure 4:
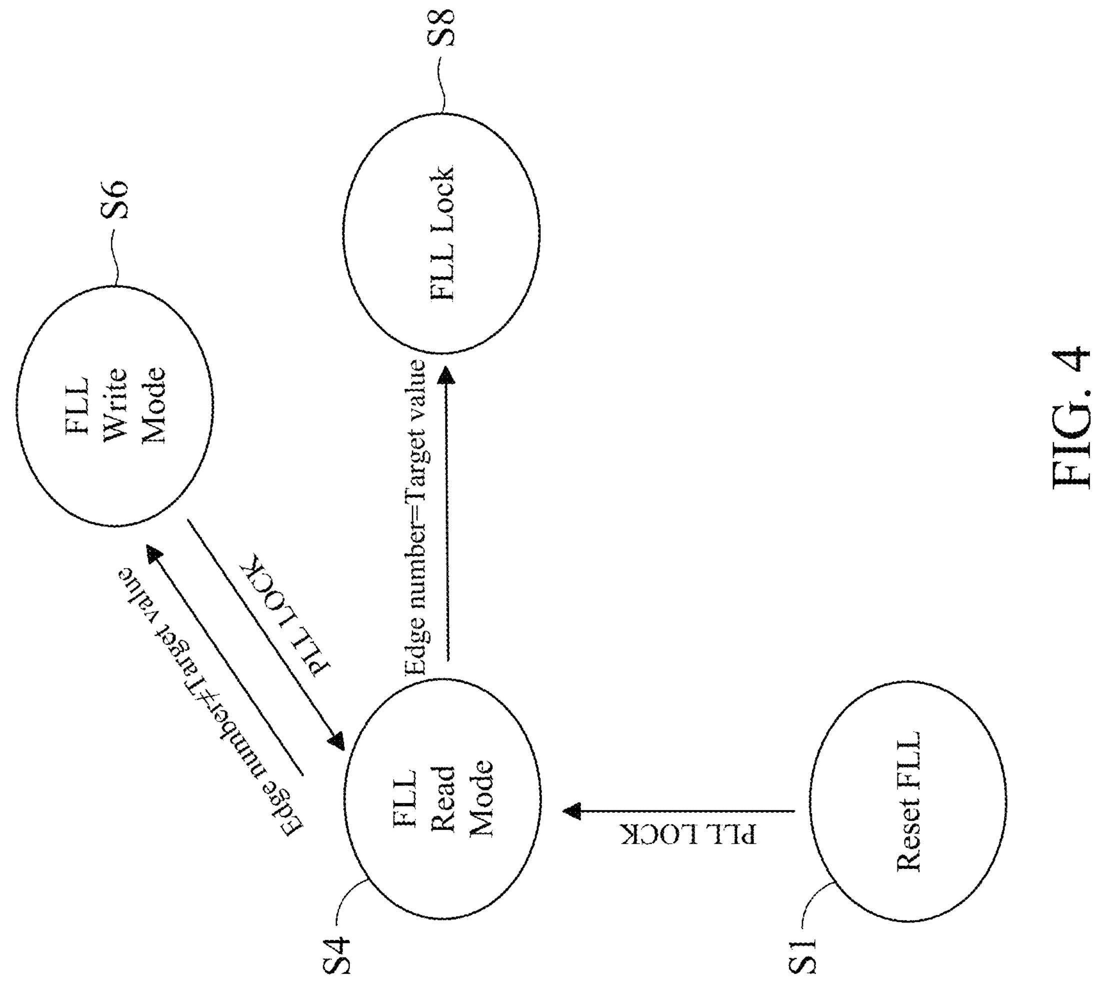
FIG. 4 is a state diagram of the frequency lock loop circuit according to some embodiments of the present disclosure.

FIG. 3 is a flowchart of steps performed by the frequency lock loop circuit FLL according to some embodiments of the present disclosure. FIG. 4 is a state diagram of the frequency lock loop circuit FLL according to some embodiments of the present disclosure. The frequency lock loop circuit FLL is utilized to perform the following Steps S1~S8. In Step S1, the frequency lock loop circuit FLL is reset. In Step S2, the frequency lock loop circuit FLL sets initial values of the pre-divider value PRE_DIV and the feedback divider value FBK_DIV.

In Step S3, the frequency lock loop circuit FLL waits the phase lock loop circuit PLL to be locked. If the phase lock loop circuit PLL is not locked, the frequency of the recovery clock signal PLL_CLK is unstable, such that the frequency lock loop circuit FLL obtained the wrong edge number. In response to the phase lock loop circuit PLL being locked, the phase lock loop circuit PLL utilizes the initial values of the pre-divider value and the feedback divider value to set a default frequency of the recovery clock signal PLL_CLK. In other words, the default frequency of the recovery clock signal PLL_CLK=OSC_IN* the initial value of FBK_DIV/ the initial value of PRE_DIV.

In Step S4, the frequency lock loop circuit FLL enters the read mode to obtain the edge number. In Step S5, the frequency lock loop circuit FLL determines whether the edge number is equal to the target value. If the frequency lock loop circuit FLL determines that the edge number is not equal to the target value (i.e., in response to the edge number being not equal to the target value), Step S6 is performed. If the frequency lock loop circuit FLL determines that the edge number is equal to the target value (i.e., in response to the edge number being equal to the target value), Step S8 is performed.

In Step S6, the frequency lock loop circuit FLL enters a write mode to perform Step S7. In Step S7, the frequency lock loop circuit FLL adjusts one of the pre-divider value PRE_DIV and the feedback divider value FBK_DIV, and then Steps S3 and S4 are sequentially performed. In other words, the frequency lock loop circuit FLL enters the read mode (i.e., Step S4) after one of the pre-divider value PRE_DIV and the feedback divider value FBK_DIV is adjusted (i.e., Step S7) and the phase lock loop circuit PLL is locked (i.e., Step S3).

Figure 5:
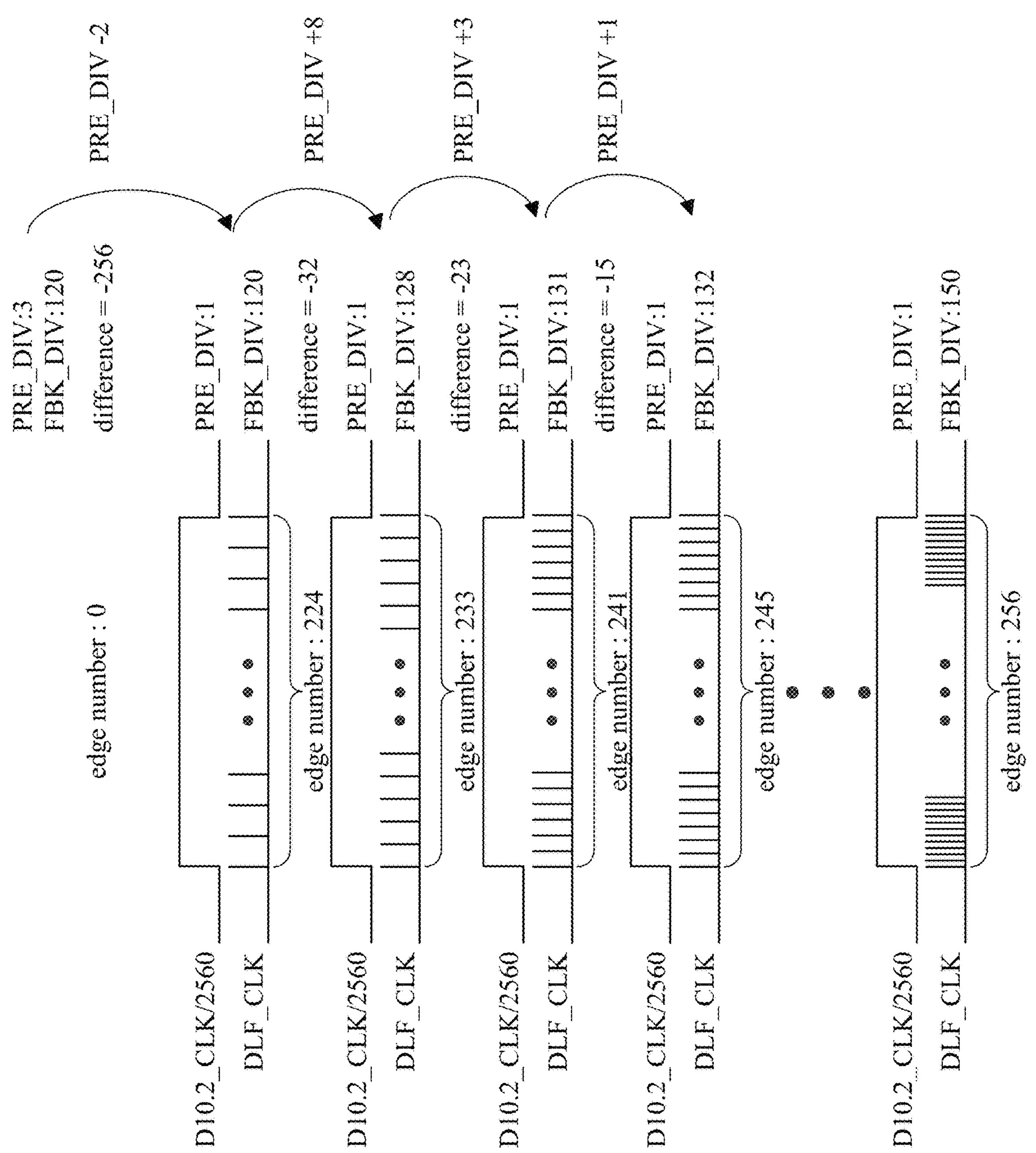
FIG. 5 is a drawing for illustrating that the frequency lock loop circuit adjusts one of a pre-divider value and a feedback divider value based on a difference according to some embodiments of the present disclosure.

In Step S8, the frequency lock loop circuit FLL is locked to lock the frequency of the recovery clock signal PLL_CLK to the frequency of the input data clock signal D10.2_CLK. For example, the frequency of the input data clock signal D10.2_CLK is equal to 4050 MHz, the input reference clock signal OSC_IN is equal to 27 MHz, and the target value is equal to 256, as shown in FIG. 5, one of the pre-divider value PRE_DIV and the feedback divider value FBK_DIV are adjusted by Step S7, and finally, when the edge number is equal to the target value (i.e., the edge number=256 so that the determined result of Step S5 is Yes), the recovery clock signal PLL_CLK=OSC_IN*FBK_DIV/PRE_DIV=27 MHz*150/1=4050 MHz. In other words, the frequency lock loop circuit FLL is locked to lock the frequency of the recovery clock signal PLL_CLK to the frequency of the input data clock signal D10.2_CLK. In addition, in Step S8, the frequency lock loop circuit further checks a pattern (i.e., 0101010) of the input data clock signal D10.2_CLK to ensure that the input data clock signal D10.2_CLK is valid data after determining that the edge number is equal to the target value (i.e., Step S5 is determined to be Yes).

In some embodiments of the present disclosure, the frequency lock loop circuit FLL calculates a difference between the edge number and the target value, thereby adjusting one of the pre-divider value PRE_DIV and the feedback divider value FBK_DIV based on the difference.

In response to an absolute value of the difference being larger than or equal to 128, the frequency lock loop circuit FLL adjusts the pre-divider value PRE_DIV.

In detail, in response to the absolute value of the difference being larger than or equal to 192, the frequency lock loop circuit FLL adds or subtracts 2 to the pre-divider value PRE_DIV. Specifically, when difference is negative (i.e., the difference is less than or equal to −192), the frequency lock loop circuit FLL subtracts 2 to the pre-divider value PRE_DIV. Specifically, when difference is positive (i.e., the difference is larger than or equal to 192), the frequency lock loop circuit FLL adds 2 to the pre-divider value PRE_DIV. For example, as shown in FIG. 5, after the frequency lock loop circuit FLL is reset, the edge number is equal to 0, the target value is equal to 256, and the initial pre-divider value PRE_DIV is equal to 3. The difference is equal to −256, and thus the frequency lock loop circuit FLL subtracts 2 to the pre-divider value PRE_DIV, such that the pre-divider value PRE_DIV becomes 1.

In detail, in response to the absolute value of the difference being larger than or equal to 128 and less than 192, the frequency lock loop circuit FLL adds or subtracts 1 to the pre-divider value PRE_DIV. Specifically, when difference is negative (i.e., the difference is less than or equal to −128 and larger than −192), the frequency lock loop circuit FLL subtracts 1 to the pre-divider value PRE_DIV. Specifically, when difference is positive (i.e., the difference is larger than or equal to 128 and less than 192), the frequency lock loop circuit FLL adds 1 to the pre-divider value PRE_DIV.

In response to the absolute value of the difference being less than 128, the frequency lock loop circuit FLL adjusts the feedback divider value FBK_DIV.

In detail, in response to the absolute value of the difference being larger than or equal to 32 and less than 128, the frequency lock loop circuit FLL adds or subtracts an integer that rounds up a value of dividing the absolute value of the difference by 4 to the feedback divider value FBK_DIV. Specifically, when difference is negative (i.e., the difference is less than or equal to −32 and larger than −128), the frequency lock loop circuit FLL adds an integer that rounds up a value of dividing the absolute value of the difference by 4 to the feedback divider value FBK_DIV. Specifically, when difference is positive (i.e., the difference is larger than or equal to 32 and less than 128), the frequency lock loop circuit FLL subtracts an integer that rounds up a value of dividing the absolute value of the difference by 4 to the feedback divider value FBK_DIV. For example, as shown in FIG. 5, if the edge number is equal to 224, the target value is equal to 256, and the current feedback divider value FBK_DIV is equal to 120. The difference is equal to −32, and thus the frequency lock loop circuit FLL adds 8 (i.e., [|−32/4|]=8) to the feedback divider value FBK_DIV, such that the feedback divider value FBK_DIV becomes 128.

In detail, in response to the absolute value of the difference being larger than or equal to 16 and less than 32, the frequency lock loop circuit FLL adds or subtracts an integer that rounds up a value of dividing the absolute value of the difference by 8 to the feedback divider value FBK_DIV. Specifically, when difference is negative (i.e., the difference is less than or equal to −16 and larger than −32), the frequency lock loop circuit FLL adds an integer that rounds up a value of dividing the absolute value of the difference by 8 to the feedback divider value FBK_DIV. Specifically, when difference is positive (i.e., the difference is larger than or equal to 16 and less than 32), the frequency lock loop circuit FLL subtracts an integer that rounds up a value of dividing the absolute value of the difference by 8 to the feedback divider value FBK_DIV. For example, as shown in FIG. 5, if the edge number is equal to 233, the target value is equal to 256, and the current feedback divider value FBK_DIV is equal to 128. The difference is equal to −23, and thus the frequency lock loop circuit FLL adds 3 (i.e., [|−23|/8]=3) to the feedback divider value FBK_DIV, such that the feedback divider value FBK_DIV becomes 131.

In detail, in response to the absolute value of the difference being larger than or equal to 8 and less than 16, the frequency lock loop circuit FLL adds or subtracts an integer that rounds up a value of dividing the absolute value of the difference by 16 to the feedback divider value FBK_DIV. Specifically, when difference is negative (i.e., the difference is less than or equal to −8 and larger than −16), the frequency lock loop circuit FLL adds an integer that rounds up a value of dividing the absolute value of the difference by 16 to the feedback divider value FBK_DIV. Specifically, when difference is positive (i.e., the difference is larger than or equal to 8 and less than 16), the frequency lock loop circuit FLL subtracts an integer that rounds up a value of dividing the absolute value of the difference by 16 to the feedback divider value FBK_DIV. For example, as shown in FIG. 5, if the edge number is equal to 241, the target value is equal to 256, and the current feedback divider value FBK_DIV is equal to 131. The difference is equal to −15, and thus the frequency lock loop circuit FLL adds 1 ([|−15|/16]=1) to the feedback divider value FBK_DIV, such that the feedback divider value FBK_DIV becomes 132.

In detail, in response to the absolute value of the difference being larger than or equal to 4 and less than 8, the frequency lock loop circuit FLL adds or subtracts an integer that rounds up a value of dividing the absolute value of the difference by 32 to the feedback divider value FBK_DIV. Specifically, when difference is negative (i.e., the difference is less than or equal to −4 and larger than −8), the frequency lock loop circuit FLL adds an integer that rounds up a value of dividing the absolute value of the difference by 32 to the feedback divider value FBK_DIV. Specifically, when difference is positive (i.e., the difference is larger than or equal to 4 and less than 8), the frequency lock loop circuit FLL subtracts an integer that rounds up a value of dividing the absolute value of the difference by 32 to the feedback divider value FBK_DIV.

In detail, in response to the absolute value of the difference being less than 4, the frequency lock loop circuit FLL adds or subtracts 1 to the feedback divider value FBK_DIV. Specifically, when difference is negative (i.e., the difference is larger than −4), the frequency lock loop circuit FLL adds 1 to the feedback divider value FBK_DIV. Specifically, when difference is positive (i.e., the difference is less than 4), the frequency lock loop circuit FLL subtracts 1 to the feedback divider value FBK_DIV.

Figure 6:
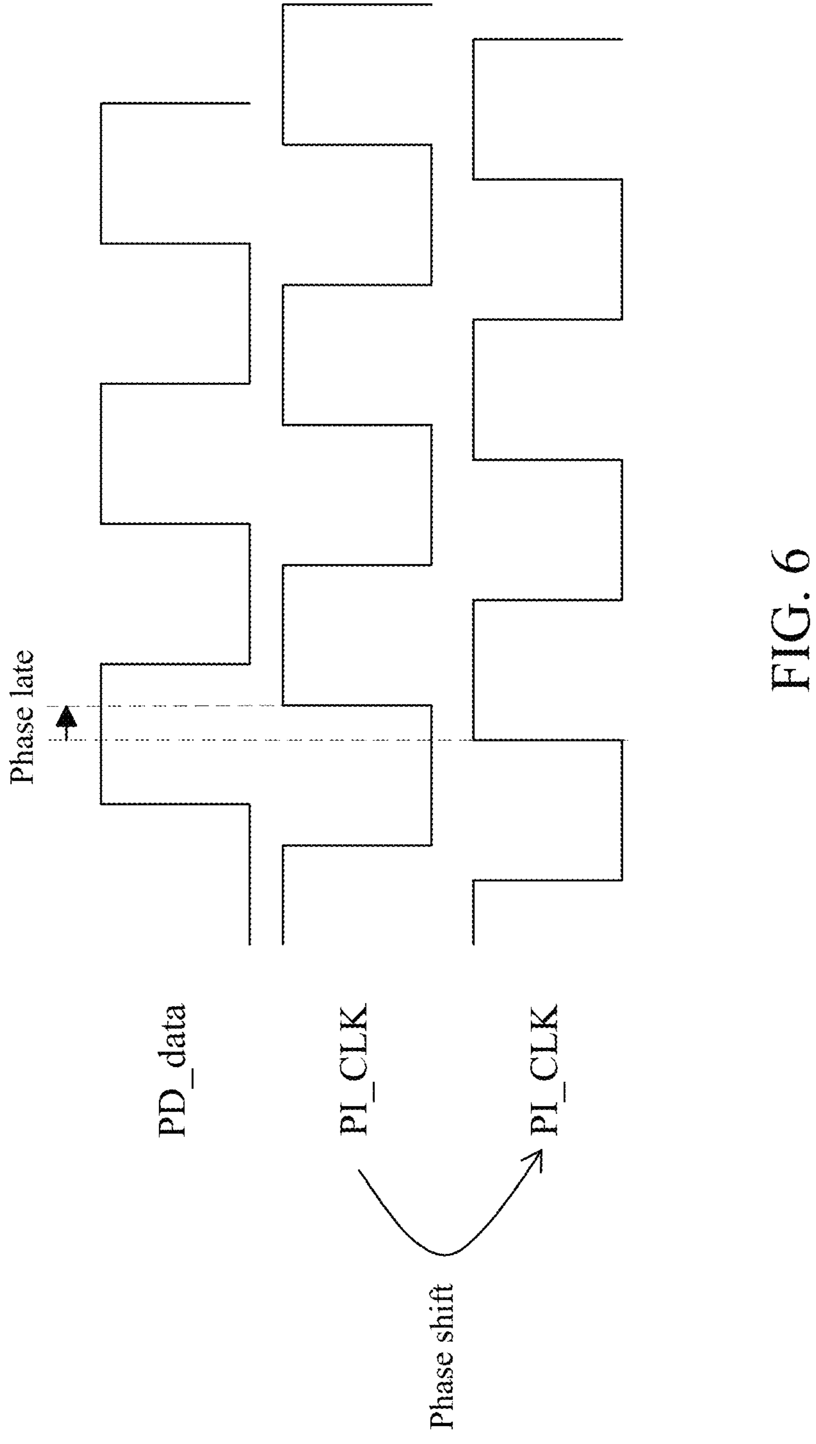
FIG. 6 and FIG. 7 are drawings for illustrating that a phase interpolator generates a phase-shifted recovery clock signal.
Figure 7:
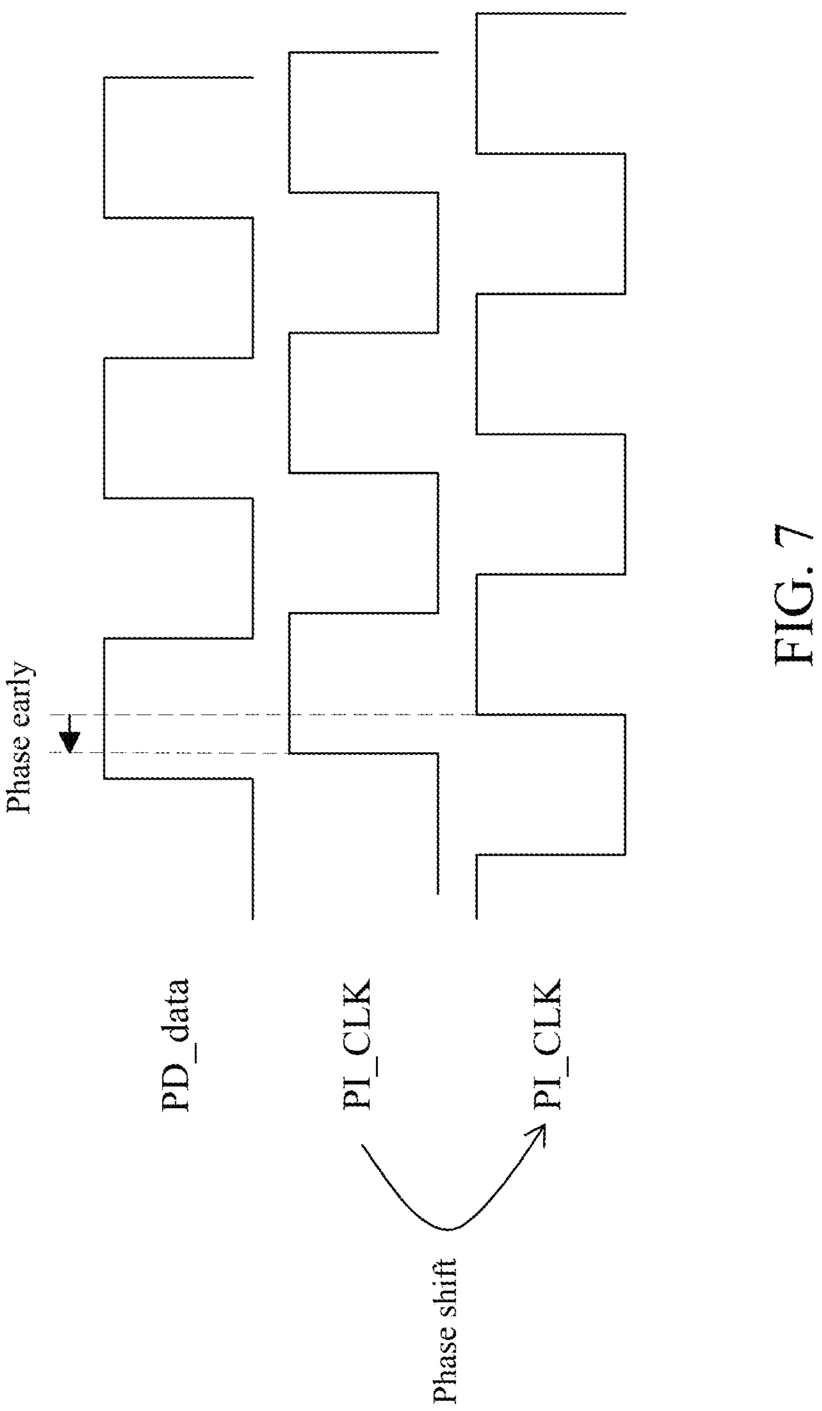

The phase interpolator 170 generates the phase-shifted recovery clock signal PI_CLK by shifting the phase of sampling clock up or down the recovery clock signal PLL_CLK. FIG. 6 and FIG. 7 are drawings for illustrating that the phase interpolator 170 generates the phase-shifted recovery clock signal PI_CLK.

As shown in FIG. 6, the rising edge of the phase-shifted recovery clock signal PI_CLK is determined to be late with respect to the center of a high level period of the data signal PD_data according to the control signal UP/DN. Therefore, the phase interpolator 170 shifts up the phase of sampling clock of the recovery clock signal PLL_CLK, such that the rising edge of the phase-shifted recovery clock signal PI_CLK is positioned at the center of a high level period of the data signal PD_data.

As shown in FIG. 7, the rising edge of the phase-shifted recovery clock signal PI_CLK is determined to be early with respect to the center of a high level period of the data signal PD_data according to the control signal UP/DN. Therefore, the phase interpolator 170 shifts down the phase of sampling clock of the recovery clock signal PLL_CLK, such that the rising edge of the phase-shifted recovery clock signal PI_CLK is positioned at the center of a high level period of the data signal PD_data.

Figure 8:
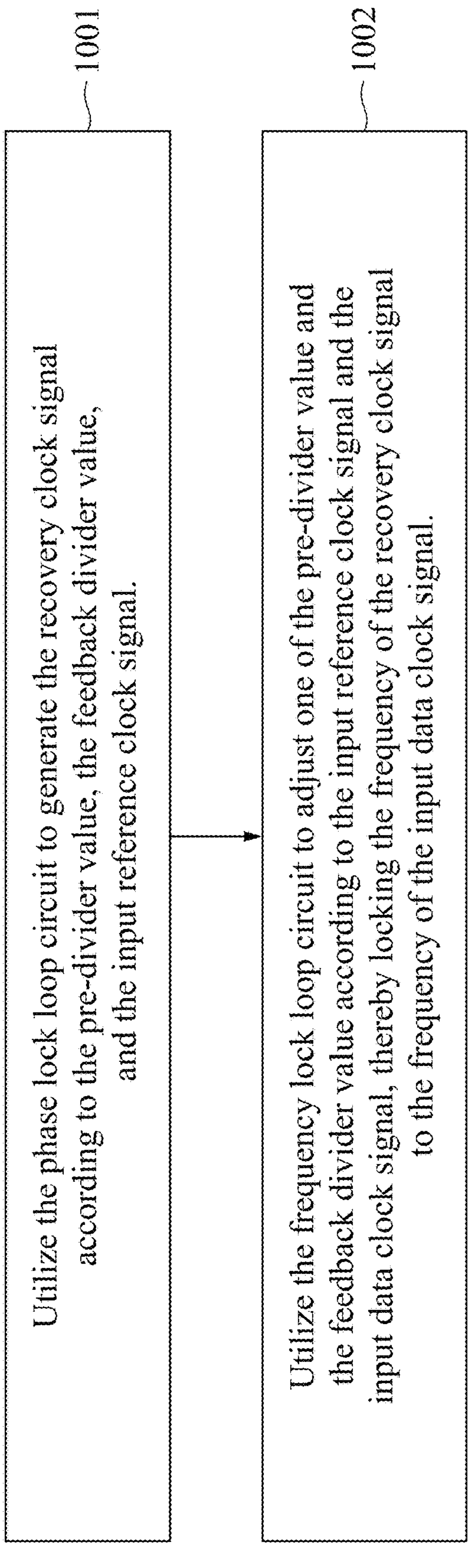
FIG. 8 is a flowchart of a method for locking a frequency of a recovery clock signal of a digital clock data recovery circuit.

FIG. 8 is a flowchart of a method 1000 for locking the frequency of the recovery clock signal PLL_CLK of the digital clock data recovery circuit 10. In Step 1001, the phase lock loop circuit PLL is utilized to generate the recovery clock signal PLL_CLK according to the pre-divider value PRE_DIV, the feedback divider value FBK_DIV, and the input reference clock signal OSC_IN. In Step 1002, the frequency lock loop circuit FLL is utilized to adjust one of the pre-divider value PRE_DIV and the feedback divider value FBK_DIV according to the input reference clock signal OSC_IN and the input data clock signal D10.2_CLK, thereby locking the frequency of the recovery clock signal PLL_CLK to the frequency of the input data clock signal OSC_IN.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A digital clock data recovery circuit, comprising:

a phase lock loop circuit configured to generate a recovery clock signal according to a pre-divider value, a feedback divider value, and an input reference clock signal; and a frequency lock loop circuit coupled to the phase lock loop circuit and configured to adjust one of the pre-divider value and the feedback divider value according to the input reference clock signal and an input data clock signal, thereby locking a frequency of the recovery clock signal to a frequency of the input data clock signal;

wherein the frequency lock loop circuit is implemented by a digital circuit;

wherein the digital clock data recovery circuit operates in a data recovery mode after the frequency of the recovery clock signal is locked.

2. The digital clock data recovery circuit of claim 1, wherein the phase lock loop circuit is configured to multiply the input reference clock signal by a ratio of the feedback divider value to the pre-divider value, thereby generating the recovery clock signal.

3. The digital clock data recovery circuit of claim 1, further comprising:

a first frequency divider coupled to the frequency lock loop circuit and configured to generate a first dividing signal; and a second frequency divider coupled to the frequency lock loop circuit and configured to generate a second dividing signal;

wherein a frequency of the first dividing signal is 1/M times of the frequency of the input data clock signal and a frequency of the second dividing signal is 1/N times of the frequency of the recovery clock signal, and M>N.

4. The digital clock data recovery circuit of claim 3, wherein M is equal to 2560, and N is equal to 5, and the digital clock data recovery circuit operates at a half-rate.

5. The digital clock data recovery circuit of claim 3, wherein the frequency lock loop circuit is configured to obtain an edge number by counting number of rising edges of the second dividing signal existing during a high level period of the first dividing signal, wherein in response to the edge number being equal to a target value, the frequency of the recovery clock signal is locked to the frequency of the input data clock signal.

6. The digital clock data recovery circuit of claim 5, wherein the target value is equal to 256.

7. The digital clock data recovery circuit of claim 5, wherein the frequency lock loop circuit is configured to perform following steps:

resetting the frequency lock loop circuit;

setting initial values of the pre-divider value and the feedback divider value;

waiting the phase lock loop circuit to be locked;

entering a read mode to determine whether the edge number is equal to the target value, in response to the phase lock loop circuit being locked;

entering a write mode to adjust one of the pre-divider value and the feedback divider value, in response to the edge number being not equal to the target value;

entering the read mode after one of the pre-divider value and the feedback divider value is adjusted and the phase lock loop circuit is locked; and locking the frequency of the recovery clock signal to the frequency of the input data clock signal, in response to the edge number being equal to the target value.

8. The digital clock data recovery circuit of claim 7, wherein the frequency lock loop circuit is further configured to check a pattern of the input data clock signal to ensure that the input data clock signal is valid data after determining that the edge number is equal to the target value.

9. The digital clock data recovery circuit of claim 5, wherein the frequency lock loop circuit is configured to calculate a difference between the edge number and the target value, thereby adjusting one of the pre-divider value and the feedback divider value based on the difference.

10. The digital clock data recovery circuit of claim 9, wherein in response to an absolute value of the difference being larger than or equal to 128, the frequency lock loop circuit adjusts the pre-divider value.

11. The digital clock data recovery circuit of claim 10, wherein in response to the absolute value of the difference being larger than or equal to 192, the frequency lock loop circuit adds or subtracts 2 to the pre-divider value; and in response to the absolute value of the difference being larger than or equal to 128 and less than 192, the frequency lock loop circuit adds or subtracts 1 to the pre-divider value.

12. The digital clock data recovery circuit of claim 9, wherein in response to an absolute value of the difference being less than 128, the frequency lock loop circuit adjusts the feedback divider value.

13. The digital clock data recovery circuit of claim 12, wherein in response to the absolute value of the difference being larger than or equal to 32 and less than 128, the frequency lock loop circuit adds or subtracts an integer that rounds up a value of dividing the absolute value of the difference by 4 to the feedback divider value;

in response to the absolute value of the difference being larger than or equal to 16 and less than 32, the frequency lock loop circuit adds or subtracts the integer that rounds up the value of dividing the absolute value of the difference by 8 to the feedback divider value;

in response to the absolute value of the difference being larger than or equal to 8 and less than 16, the frequency lock loop circuit adds or subtracts the integer that rounds up the value of dividing the absolute value of the difference by 16 to the feedback divider value;

in response to the absolute value of the difference being larger than or equal to 4 and less than 8, the frequency lock loop circuit adds or subtracts the integer that rounds up the value of dividing the absolute value of the difference by 32 to the feedback divider value; and in response to the absolute value of the difference being less than 4, the frequency lock loop circuit adds or subtracts 1 to the feedback divider value.

14. The digital clock data recovery circuit of claim 1, further comprising:

an equalizer configured to receive input data signals to generate the input data clock signal;

a phase detector coupled to the equalizer and the phase lock loop circuit and configured to use the recovery clock signal to sample the input data signals;

a loop filter coupled to the phase detector and configured to provide filtering function;

a phase integrator coupled to the phase detector and the loop filter and configured to quantify a phase difference according to a control signal outputted by the phase detector; and a phase interpolator coupled to the phase integrator, the phase lock loop circuit, and the phase detector and configured to shift a phase of the recovery clock signal according to the phase difference;

wherein the equalizer, the phase detector, the loop filter, the phase integrator, and the phase interpolator are all implemented by digital circuits.

15. A method for locking frequency of recovery clock signal of digital clock data recovery circuit, comprising:

utilizing a phase lock loop circuit to generate the recovery clock signal according to a pre-divider value, a feedback divider value, and an input reference clock signal; and utilizing a frequency lock loop circuit to adjust one of the pre-divider value and the feedback divider value according to the input reference clock signal and an input data clock signal, thereby locking a frequency of the recovery clock signal to a frequency of the input data clock signal;

wherein the frequency lock loop circuit is implemented by a digital circuit;

wherein the digital clock data recovery circuit operates in a data recovery mode after the frequency of the recovery clock signal is locked.

16. The method of claim 15, wherein the input reference clock signal is multiplied by a ratio of the feedback divider value to the pre-divider value, thereby generating the recovery clock signal.

17. The method of claim 15, further comprising:

obtaining an edge number by counting number of rising edges of a second dividing signal existing during a high level period of a first dividing signal; and locking the frequency of the recovery clock signal to the frequency of the input data clock signal, in response to the edge number being equal to a target value;

wherein a frequency of the first dividing signal is 1/M times of the frequency of the input data clock signal and a frequency of the second dividing signal is 1/N times of the frequency of the recovery clock signal, and M>N.

18. The method of claim 17, further comprising:

resetting the frequency lock loop circuit;

setting initial values of the pre-divider value and the feedback divider value;

waiting the phase lock loop circuit to be locked;

entering a read mode to determine whether the edge number is equal to the target value, in response to the phase lock loop circuit being locked;

entering a write mode to adjust one of the pre-divider value and the feedback divider value, in response to the edge number being not equal to the target value; and entering the read mode after one of the pre-divider value and the feedback divider value is adjusted and the phase lock loop circuit is locked.

19. The method of claim 18, further comprising:

checking a pattern of the input data clock signal to ensure that the input data clock signal is valid data after determining that the edge number is equal to the target value.

20. The method of claim 17, further comprising:

calculating a difference between the edge number and the target value, thereby adjusting one of the pre-divider value and the feedback divider value based on the difference.

* * * * *